United States Patent
Song

(10) Patent No.: US 12,422,498 B2
(45) Date of Patent: Sep. 23, 2025

(54) APPARATUS AND METHOD FOR DIAGNOSING STATE OF BATTERY

(71) Applicant: LG ENERGY SOLUTION, LTD., Seoul (KR)

(72) Inventor: Yee-Gahng Song, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 337 days.

(21) Appl. No.: 17/925,753

(22) PCT Filed: Oct. 6, 2021

(86) PCT No.: PCT/KR2021/013730
§ 371 (c)(1),
(2) Date: Nov. 16, 2022

(87) PCT Pub. No.: WO2022/080746
PCT Pub. Date: Apr. 21, 2022

(65) Prior Publication Data
US 2023/0176140 A1   Jun. 8, 2023

(30) Foreign Application Priority Data
Oct. 16, 2020   (KR) .................... 10-2020-0134587

(51) Int. Cl.
*G01R 31/396* (2019.01)
*G01R 31/36* (2020.01)
*G01R 31/392* (2019.01)

(52) U.S. Cl.
CPC ....... *G01R 31/396* (2019.01); *G01R 31/3648* (2013.01); *G01R 31/392* (2019.01)

(58) Field of Classification Search
CPC . G01R 31/396; G01R 31/392; G01R 31/3648
See application file for complete search history.

(56) References Cited

U.S. PATENT DOCUMENTS

| | | | |
|---|---|---|---|
| 6,388,447 B1* | 5/2002 | Hall ................. | H02J 7/007184 324/426 |
| 2011/0200902 A1* | 8/2011 | Araki ................ | H01M 8/04671 429/432 |

(Continued)

FOREIGN PATENT DOCUMENTS

| | | | |
|---|---|---|---|
| JP | 3702861 B2 | 10/2005 | |
| JP | 2010-108645 A | 5/2010 | |

(Continued)

OTHER PUBLICATIONS

International Search Report (PCT/ISA/210) issued in PCT/KR2021/013730, dated Jan. 24, 2022.

(Continued)

Primary Examiner — Lisa M Caputo
Assistant Examiner — Sharah Zaab
(74) Attorney, Agent, or Firm — Birch, Stewart, Kolasch & Birch, LLP

(57) ABSTRACT

An apparatus for diagnosing a state of a battery according to an embodiment of the present disclosure can include a measuring unit for measuring a voltage of each of a plurality of batteries; a profile generating unit for receiving voltage information for the voltage of each of the plurality of batteries measured by the measuring unit, and generating a distribution degree profile for the voltage of each of the plurality of batteries based on the received voltage information; and a control unit for setting a reference voltage for the distribution degree profile based on a criterion profile preset for the plurality of batteries, and diagnosing a state of each of the plurality of batteries by comparing the measured voltage of each of the plurality of batteries with the set reference voltage.

10 Claims, 5 Drawing Sheets

(56) References Cited

U.S. PATENT DOCUMENTS

| | | |
|---|---|---|
| 2012/0293127 A1 | 11/2012 | Higashi et al. |
| 2015/0066407 A1* | 3/2015 | Joe .................. G01R 31/392 |
| | | 702/63 |
| 2017/0031404 A1 | 2/2017 | Yamamoto et al. |
| 2017/0067967 A1* | 3/2017 | Bryngelsson ........... B60L 58/12 |
| 2017/0125830 A1 | 5/2017 | Jeon |
| 2020/0003839 A1 | 1/2020 | Yamamoto et al. |
| 2021/0156923 A1 | 5/2021 | Nam et al. |

FOREIGN PATENT DOCUMENTS

| | | | |
|---|---|---|---|
| JP | 2011-176963 A | 9/2011 | |
| JP | 4928618 B2 | 5/2012 | |
| JP | 2017-194468 A | 10/2017 | |
| JP | 6374193 B2 | 8/2018 | |
| JP | 2020-18089 A | 1/2020 | |
| JP | 2020018089 * | 1/2020 | ........... H01M 10/44 |
| JP | WO2019/106754 A1 | 5/2020 | |
| JP | 2020-169943 A | 10/2020 | |
| KR | 10-1376910 B1 | 3/2014 | |
| KR | 20150133065 * | 11/2015 | ........... G01R 19/165 |
| KR | 10-2016-0046547 A | 4/2016 | |
| KR | 10-1711258 B1 | 2/2017 | |
| KR | 10-1724500 B1 | 4/2017 | |
| KR | 10-1769182 B1 | 8/2017 | |
| KR | 10-2019-0061809 A | 6/2019 | |
| KR | 10-2019-0090501 A | 8/2019 | |
| KR | 10-2020-0005290 A | 1/2020 | |
| KR | 10-2156404 B1 | 9/2020 | |

OTHER PUBLICATIONS

Extended European Search Report for European Application No. 21880393.0, dated Dec. 11, 2023.

* cited by examiner

APPARATUS AND METHOD FOR DIAGNOSING STATE OF BATTERY

TECHNICAL FIELD

The present application claims priority to Korean Patent Application No. 10-2020-0134587 filed on Oct. 16, 2020 in the Republic of Korea, the disclosures of which are incorporated herein by reference.

The present disclosure relates to an apparatus and method for diagnosing a state of a battery, and more particularly, to an apparatus and method for diagnosing a state of a battery, which may probabilistically diagnose a state of a battery.

BACKGROUND ART

Recently, the demand for portable electronic products such as notebook computers, video cameras and portable telephones has increased sharply, and electric vehicles, energy storage batteries, robots, satellites and the like have been developed in earnest. Accordingly, high-performance batteries allowing repeated charging and discharging are being actively studied.

Batteries commercially available at present include nickel-cadmium batteries, nickel hydrogen batteries, nickel-zinc batteries, lithium batteries and the like. Among them, the lithium batteries are in the limelight since they have almost no memory effect compared to nickel-based batteries and also have very low self-discharging rate and high energy density.

Even for batteries of the same specification, the difference in electrochemical characteristics may increase due to variations in the production process and variations in the actual use environment after shipment. For example, a gap between batteries may lead to a behavioral deviation during a charging and discharging cycle, and thus heat generation and voltage difference may be accelerated in a non-linear manner.

Conventionally, a fixed threshold value or a fixed threshold range is set, and the battery in an abnormal state is diagnosed using the set threshold value or threshold range. However, this conventional method has a problem in that it does not reflect the degradation of the battery over time. In addition, due to the complexity of the numerical determination model for setting the threshold value or threshold range by reflecting the degradation of the battery, there is a problem in that the actual implementation becomes very difficult.

DISCLOSURE

Technical Problem

The present disclosure is designed to solve the problems of the related art, and therefore the present disclosure is directed to providing an apparatus and method for diagnosing a state of a battery, which may probabilistically diagnose a state of a battery.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

An apparatus according to one aspect of the present disclosure may comprise: a measuring unit configured to measure a voltage of each of a plurality of batteries; a profile generating unit configured to receive voltage information for the voltage of each of the plurality of batteries measured by the measuring unit, and generate a distribution degree profile for the voltage of each of the plurality of batteries based on the received voltage information; and a control unit configured to set a reference voltage for the distribution degree profile based on a criterion profile preset for the plurality of batteries, and diagnose a state of each of the plurality of batteries by comparing the measured voltage of each of the plurality of batteries with the set reference voltage.

The profile generating unit may be configured to generate the distribution degree profile representing normal distribution for the voltage of each of the plurality of batteries.

The criterion profile may represent a distribution degree for a voltage of each of the plurality of batteries measured in a beginning of life (BOL) state.

The control unit may be configured to set the reference voltage for the distribution degree profile to correspond to a criterion voltage preset for the criterion profile.

The control unit may be configured to set the reference voltage by applying a criterion density corresponding to the criterion voltage to an average voltage of the criterion profile in an entire voltage range of the criterion profile to the distribution degree profile.

The control unit may be further configured to calculate a voltage corresponding to the criterion density in the distribution degree profile based on an average voltage of the distribution degree profile, and set the calculated voltage as the reference voltage.

The control unit may be configured to diagnose that the state of a first battery among the plurality of batteries in which the measured voltage is less than the reference voltage is in an abnormal state.

The control unit may be configured to diagnose that the state of a second battery among the plurality of batteries in which the measured voltage is equal to or greater than the reference voltage in in a normal state.

A battery pack according to another aspect of the present disclosure may comprise the apparatus for diagnosing a state of a battery according to an aspect of the present disclosure.

A method according to another aspect of the present disclosure may comprise: a measuring step of measuring a voltage of each of a plurality of batteries; a profile generating step of generating a distribution degree profile for the voltage of each of the plurality of batteries measured in the measuring step; a reference voltage setting step of setting a reference voltage for the distribution degree profile based on a criterion profile preset for the plurality of batteries; and a state diagnosing step of diagnosing a state of each of the plurality of batteries by comparing the measured voltage of each of the plurality of batteries with the set reference voltage.

Advantageous Effects

According to one aspect of the present disclosure, in consideration of the BOL (Beginning of life) state and the current degradation state of the plurality of batteries, there is an advantage that the state of each of the plurality of batteries may be diagnosed.

The effects of the present disclosure are not limited to the above, and other effects not mentioned herein will be clearly understood by those skilled in the art from the appended claims.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

FIG. 1 is a diagram schematically showing an apparatus for diagnosing a state of a battery according to an embodiment of the present disclosure.

BEST MODE

It should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Additionally, in describing the present disclosure, when it is deemed that a detailed description of relevant known elements or functions renders the key subject matter of the present disclosure ambiguous, the detailed description is omitted herein.

The terms including the ordinal number such as "first", "second" and the like, may be used to distinguish one element from another among various elements, but not intended to limit the elements by the terms.

Throughout the specification, when a portion is referred to as "comprising" or "including" any element, it means that the portion may include other elements further, without excluding other elements, unless specifically stated otherwise.

In addition, terms such as a control unit described in the specification mean a unit that processes at least one function or operation, which may be implemented as hardware or software, or a combination of hardware and software.

In addition, throughout the specification, when a portion is referred to as being "connected" to another portion, it is not limited to the case that they are "directly connected", but it also includes the case where they are "indirectly connected" with another element being interposed between them.

Hereinafter, a preferred embodiment of the present disclosure will be described in detail with reference to the accompanying drawings.

Figure 1:
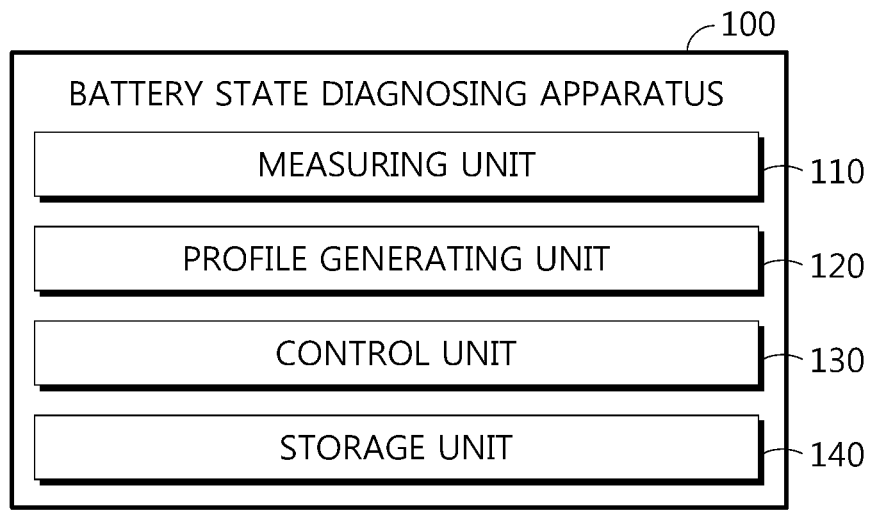

FIG. 1 is a diagram schematically showing an apparatus 100 for diagnosing a state of a battery according to an embodiment of the present disclosure.

Referring to FIG. 1, the apparatus 100 for diagnosing a state of a battery may include a measuring unit 110, a profile generating unit 120, and a control unit 130.

The measuring unit 110 may be configured to measure a voltage of each of a plurality of batteries.

Here, the battery refers to one physically separable independent cell having a negative electrode terminal and a positive electrode terminal. For example, one pouch-type lithium polymer cell may be regarded as one battery. Also, the battery may be a battery module in which one or more battery cells are connected in series and/or in parallel. Hereinafter, for convenience of explanation, it will be described that the battery is a battery cell.

Specifically, the measuring unit 110 may measure the voltage of each of the plurality of batteries, and may output voltage information for the measured voltage of each of the plurality of batteries.

The profile generating unit 120 may be configured to receive the voltage information for the voltage of each of the plurality of batteries measured by the measuring unit 110.

For example, the measuring unit 110 and the profile generating unit 120 may be connected to communicate with each other. Accordingly, the voltage information output from the measuring unit 110 may be received by the profile generating unit 120.

In addition, the profile generating unit 120 may be configured to generate a distribution degree profile P1 for the voltage of each of the plurality of batteries based on the received voltage information.

Here, the distribution degree profile P1 may be a profile representing a distribution degree for the voltage of each of the plurality of batteries. For example, the profile generating unit 120 may be configured to generate the distribution degree profile P1 representing a normal distribution for the voltage of each of the plurality of batteries.

Figure 2:
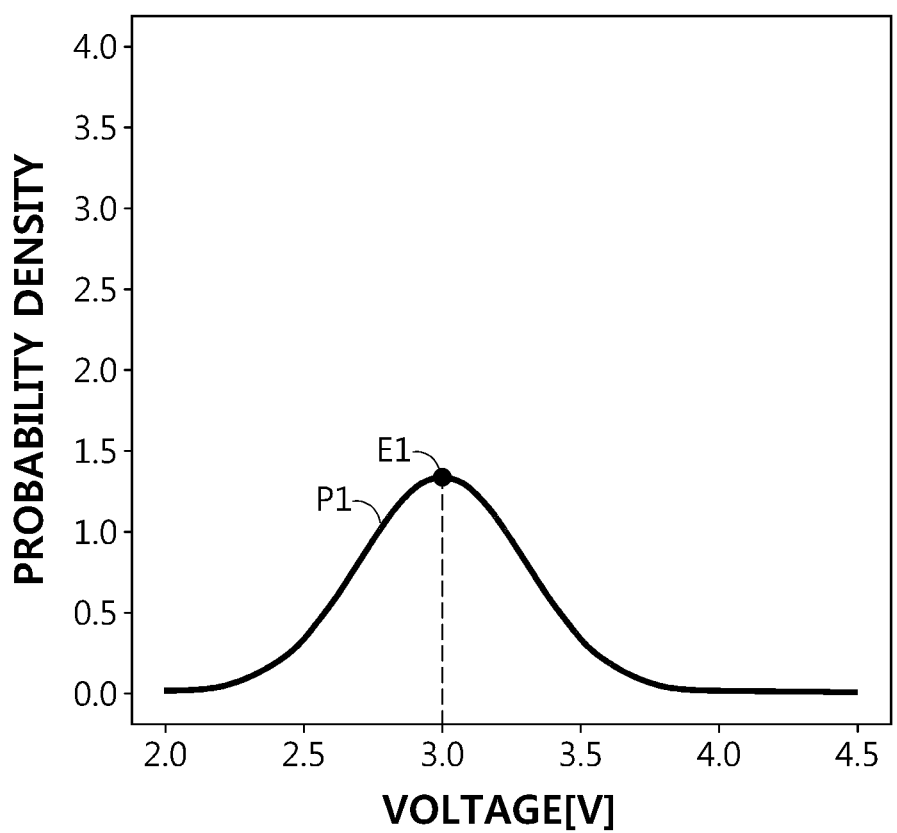
FIG. 2 is a diagram schematically showing an example of a distribution degree profile generated by the apparatus for diagnosing a state of a battery according to an embodiment of the present disclosure.

FIG. 2 is a diagram schematically showing an example of the distribution degree profile P1 generated by the apparatus 100 for diagnosing a state of a battery according to an embodiment of the present disclosure.

For example, referring to FIG. 2, the distribution degree profile P1 may be generated by the profile generating unit 120. Specifically, a distribution degree profile P1 according to a normal distribution in which an average voltage E1 is 3.0V may be generated.

The control unit 130 may be configured to set a reference voltage V1 for the distribution degree profile P1 based on a criterion profile P2 preset for the plurality of batteries.

Preferably, the profile generating unit 120 and the control unit 130 may be connected to communicate with each other. That is, the profile generating unit 120 may output the generated distribution degree profile P1, and the control unit 130 may receive the distribution degree profile P1 output from the profile generating unit 120.

Specifically, the criterion profile P2 may be a profile representing a distribution degree for the voltage of each of the plurality of batteries measured in a BOL (Beginning of life) state. For example, the voltage may be measured when the plurality of batteries are in the BOL state, and the criterion profile P2 may be generated in advance based on the measured voltage.

That is, the criterion profile P2 may be a profile representing normal distribution for the voltage of the plurality of batteries in the BOL state, and the distribution degree profile P1 may be a profile representing normal distribution for the voltage of the plurality of batteries in a current state.

Figure 3:
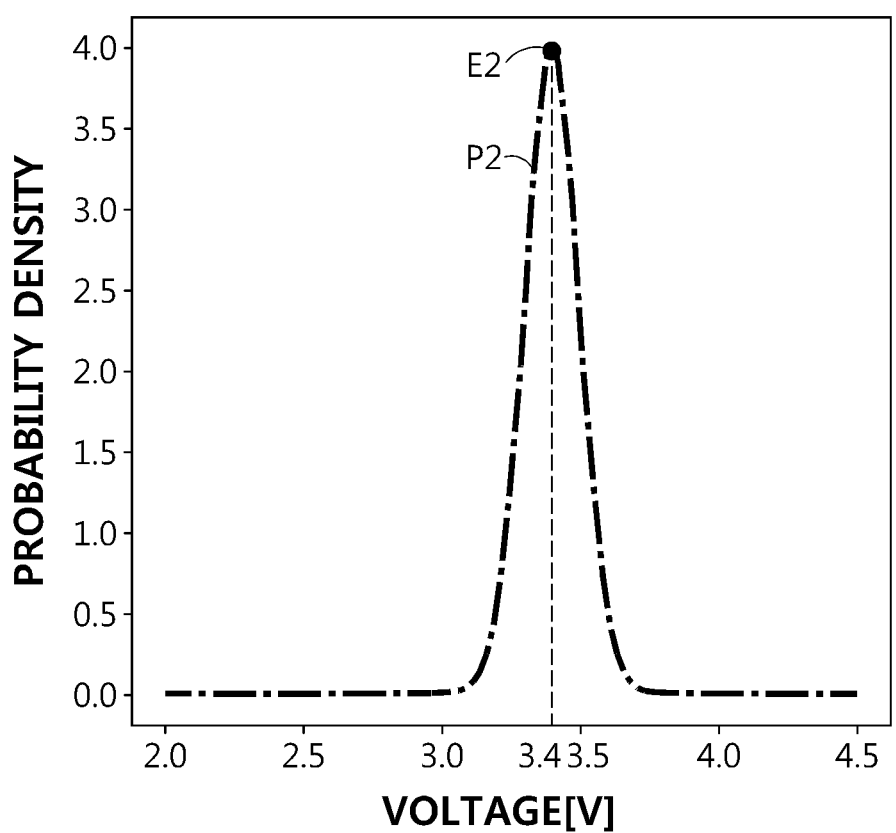
FIG. 3 is a diagram schematically showing an example of a criterion profile according to an embodiment of the present disclosure.

FIG. 3 is a diagram schematically showing an example of the criterion profile P2 according to an embodiment of the present disclosure. For example, referring to FIG. 3, the criterion profile P2 may be a profile according to a normal distribution in which an average voltage E2 is 3.4V.

Specifically, the control unit 130 may set the reference voltage V1 in the distribution degree profile P1 to correspond to the criterion voltage V2 of the criterion profile P2. That is, the reference voltage V1 may not be set based on a preset lower limit voltage value, but may be set to correspond to criterion voltage V2 of criterion profile P2. Accordingly, the control unit 130 may set the reference voltage V1 for the current state of the plurality of batteries based on the criterion profile P2 and the criterion voltage V2 reflecting the BOL state of the plurality of batteries.

Figure 4:
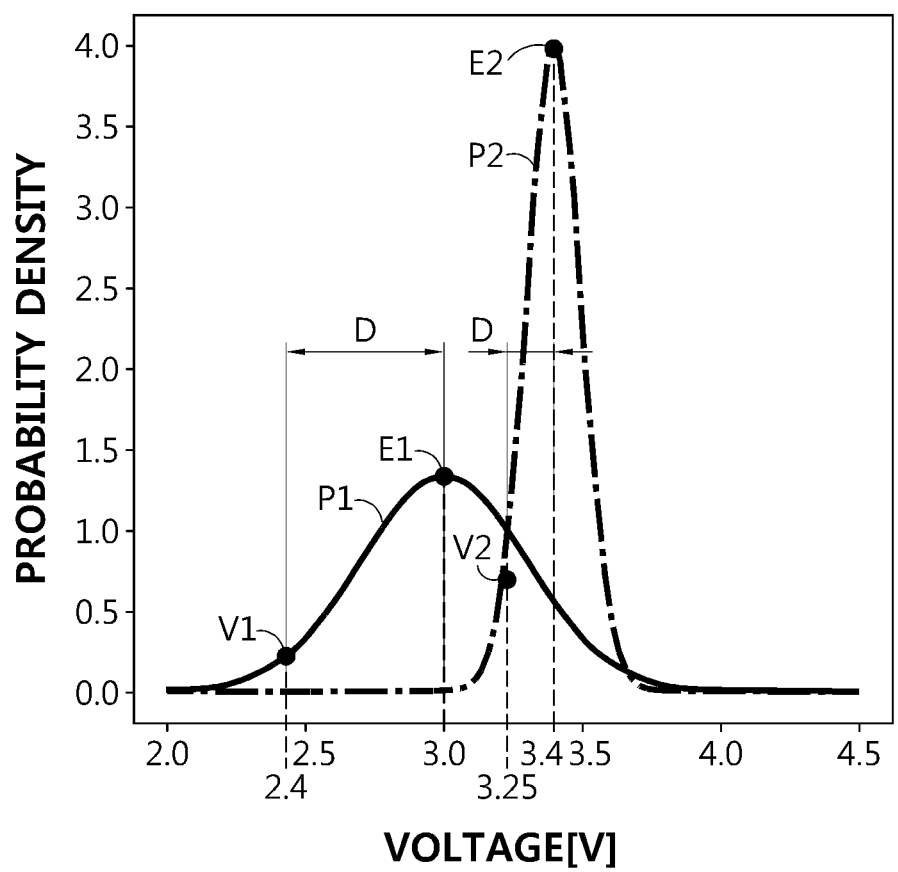
FIG. 4 is a diagram schematically showing an example of a distribution degree profile generated by the apparatus for diagnosing a state of a battery according to an embodiment of the present disclosure and a reference voltage set thereby.

FIG. 4 is a diagram schematically showing an example of the distribution degree profile P1 generated by the apparatus 100 for diagnosing a state of a battery according to an embodiment of the present disclosure and the reference voltage V1 set thereby.

For example, in the embodiment of FIG. 4, the average voltage E2 of the criterion profile P2 may be 3.4V, and the criterion voltage V2 may be 3.25V. In addition, the average voltage of the distribution degree profile P1 may be 3.0V, and the reference voltage V1 may be 2.4V.

In addition, the control unit 130 may be configured to diagnose the state of each of the plurality of batteries by comparing the measured voltage of each of the plurality of batteries with the set reference voltage V1.

For example, the control unit 130 may be configured to diagnose that the state of a battery in which the measured voltage is less than the reference voltage V1 among the plurality of batteries is an abnormal state. Also, the control unit 130 may be configured to diagnose that the state of a battery in which the measured voltage is equal to or greater than the reference voltage V1 among the plurality of batteries is a normal state.

For example, in the embodiment of FIG. 4, when the voltage measured by the measuring unit 110 is less than 2.4V among the plurality of batteries, the control unit 130 may be configured to diagnose that the state of the battery is an abnormal state. Conversely, when the voltage measured by the measuring unit 110 is equal to or greater than 2.4V among the plurality of batteries, the control unit 130 may be configured to diagnose that the state of the battery is a normal state.

That is, the apparatus 100 for diagnosing a state of a battery according to an embodiment of the present disclosure may not uniformly diagnose the state of the battery based on a preset voltage value, but may diagnose a current state of the battery by considering all of the criterion profile P2 for the battery in the BOL state and the distribution degree profile P1 for the battery in the current state. That is, since the apparatus 100 for diagnosing a state of a battery may diagnose the state of each of the plurality of batteries in consideration of the degradation of the battery, the state of each of the plurality of batteries may be more accurately diagnosed.

More specifically, the criterion profile P2 is generated based on the voltage measured when the plurality of batteries are in a BOL state, and the criterion voltage V2 may be a voltage set to detect a battery in a BOL state but in an abnormal state. Even if a plurality of batteries are degraded, the degradation of the plurality of batteries may follow the normal distribution to correspond to the criterion profile P2. Accordingly, the apparatus 100 for diagnosing a state of a battery may diagnose the state of each of the plurality of batteries in consideration of the degradation of the plurality of batteries by setting the reference voltage V1 of the distribution degree profile P1 in consideration of the criterion voltage V2 of the criterion profile P2 and diagnosing the state of the battery based on the set reference voltage V1.

In another embodiment, the control unit 130 may receive a target voltage from the outside. Here, the target voltage may be a voltage value set for diagnosing the state of a plurality of batteries in the BOL state. For example, the battery may be used in various products such as a vehicle, an energy storage system (ESS), and a home appliance. In order to appropriately change the criterion voltage V2 considered as a criterion value for diagnosing the state of the battery according to the usage of the battery, when a target voltage is received from the outside, the control unit 130 may set the target voltage as the criterion voltage V2. In addition, the control unit 130 may set the reference voltage V1 in the distribution degree profile P1 based on the criterion voltage V2 set according to the target voltage, and diagnose the state of the battery based on the set reference voltage V1. That is, since the criterion voltage V2 may be appropriately set according to the battery usage environment, there is an advantage that the state of the battery may be adaptively diagnosed based on the battery usage environment.

In addition, the control unit 130 provided to the apparatus 100 for diagnosing a state of a battery may optionally include an application-specific integrated circuit (ASIC), another chipset, a logic circuit, a register, a communication modem, and a data processing device, and the like, known in the art to execute various control logics disclosed below. In addition, when the control logic is implemented in software, the control unit 130 may be implemented as a set of program modules. At this time, the program module may be stored in a memory and executed by the control unit 130. The memory may be provided in or out of the control unit 130, and may be connected to the control unit 130 by various well-known means.

In addition, the apparatus 100 for diagnosing a state of a battery may further include a storage unit 140. The storage unit 140 may store programs, data and the like required for diagnosing a state of a battery according to the present disclosure. That is, the storage unit 140 may store data necessary for operation and function of each component of the apparatus 100 for diagnosing a state of a battery, data generated in the process of performing the operation or function, or the like. The storage unit 140 is not particularly limited in its kind as long as it is a known information storage means that can record, erase, update and read data. As an example, the information storage means may include RAM, flash memory, ROM, EEPROM, registers, and the like. In addition, the storage unit 140 may store program codes in which processes executable by the control unit 130 are defined.

For example, the information about the criterion profile P2 and the criterion voltage V2 for the plurality of batteries, the information about a criterion ratio, and the distribution degree profile P1 may be stored in the storage unit 140. In addition, the control unit 130 may access the storage unit 140 to obtain the information about the criterion profile P2 and the criterion voltage V2 for the plurality of batteries and the information about the criterion ratio.

Meanwhile, the profile generating unit 120 may generate the distribution degree profile P1 when a predetermined diagnostic cycle or diagnostic command is input. In addition, whenever the control unit 130 receives the distribution degree profile P1 from the profile generating unit 120, the control unit 130 may diagnose a current state of the plurality of batteries using the criterion profile P2 and the received distribution degree profile P1. That is, the current state of the plurality of batteries may be diagnosed based on the distribution degree profile P1 generated at a current time point.

The control unit 130 may be configured to set the reference voltage V1 for the distribution degree profile P1 to correspond to the criterion voltage V2 set for the criterion profile P2. In addition, the control unit 130 may be configured to set the calculated voltage as the reference voltage V1.

Specifically, the control unit 130 may be configured to set the reference voltage V1 by applying the criterion density D corresponding to the criterion voltage V2 to the average voltage E2 of the criterion profile P2 in the entire voltage range of the criterion profile P2 to the distribution degree profile P1.

In the embodiment of FIG. 4, the criterion density corresponding to the criterion voltage V2 to the average voltage E2 in the entire voltage range of the criterion profile P2 may be D. The control unit 130 may apply the criterion density D to the distribution degree profile P1.

Specifically, the control unit 130 may calculate a voltage corresponding to the criterion density D in the distribution degree profile P1 based on the average voltage E1 of the distribution degree profile P1. Here, the calculated voltage may be the reference voltage V1.

For example, in the embodiment of FIG. 4, when the criterion density D of the criterion profile P2 is applied to the distribution degree profile P1, the voltage corresponding to the criterion density D may be calculated as 2.4V based on the average voltage E1 of the distribution degree profile P1. That is, the criterion voltage V2 corresponding to the criterion density D in the criterion profile P2 may be 3.25V, but the voltage corresponding to the criterion density D in the distribution degree profile P1 may be 2.4V. In addition, the control unit 130 may set the calculated voltage 2.4V as the reference voltage V1. Thereafter, the control unit 130 may diagnose that the state of the battery in which the measured voltage is less than 2.4V is an abnormal state, and diagnose that the state of the battery in which the measured voltage is equal to or greater than 2.4V is a normal state.

For example, the plurality of batteries are degraded according to usage, and the degree of degradation of the plurality of batteries may be different. Therefore, in the embodiment of FIG. 4, even if the same criterion density D is applied to the criterion profile P2 and the distribution degree profile P1, the voltage difference (0.15V) between the average voltage E2 of the criterion profile P2 and the criterion voltage V2 and the voltage difference (0.6V) between the average voltage E1 of the distribution degree profile P1 and the reference voltage V1 may be different from each other.

That is, the apparatus 100 for diagnosing a state of a battery according to an embodiment of the present disclosure may set the reference voltage V1 in consideration of the degradation of the plurality of batteries by applying the criterion density D for the criterion profile P2 to the distribution degree profile P1 to calculate the reference voltage V1. Therefore, the apparatus 100 for diagnosing a state of a battery has an advantage of diagnosing the current state of the battery by comprehensively considering the normal distribution of the battery in the BOL state and the degradation of the battery.

The apparatus 100 for diagnosing a state of a battery according to the present disclosure may be applied to a BMS (Battery Management System). That is, the BMS according to the present disclosure may include the above-described apparatus 100 for diagnosing a state of a battery. In this configuration, at least some of the components of the apparatus 100 for diagnosing a state of a battery may be implemented by supplementing or adding functions of the configuration included in a conventional BMS. For example, the measuring unit 110, the profile generating unit 120, the control unit 130 and the storage unit 140 of the apparatus 100 for diagnosing a state of a battery may be implemented as components of the BMS.

In addition, the apparatus 100 for diagnosing a state of a battery according to the present disclosure may be provided to a battery pack 1. For example, the battery pack 1 according to the present disclosure may include the apparatus 100 for diagnosing a state of a battery as described above, and a battery cell B. In addition, the battery pack 1 may further include electrical equipment (a relay, a fuse, etc.), a case, and the like.

Figure 5:
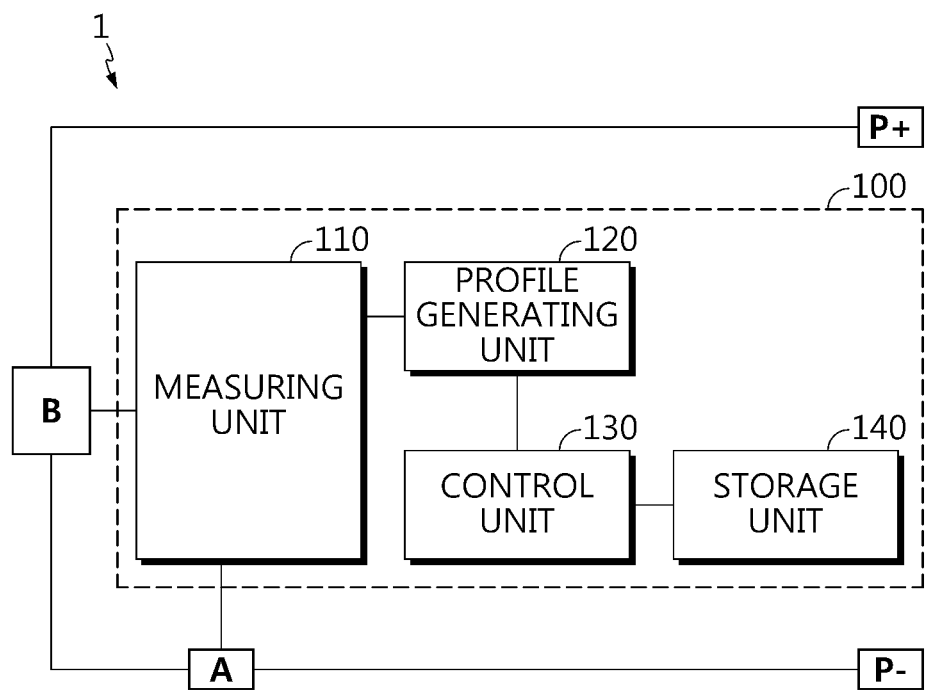
FIG. 5 is a diagram schematically showing an exemplary configuration of a battery pack including the apparatus for diagnosing a state of a battery according to an embodiment of the present disclosure.

FIG. 5 is a diagram schematically showing an exemplary configuration of a battery pack 1 including the apparatus 100 for diagnosing a state of a battery according to an embodiment of the present disclosure.

In the embodiment of FIG. 5, the battery B may be provided in plurality. The measuring unit 110 may measure a voltage of each of the plurality of batteries B, and the profile generating unit 120 may generate a distribution degree profile P1 based on the voltage of the plurality of batteries B measured by the measuring unit 110. The control unit 130 may diagnose the state of each of the batteries B based on the distribution degree profile P1 generated by the profile generating unit 120 and the criterion profile P2 preset for the batteries B.

Meanwhile, the measuring unit 110 may be connected to a current measuring unit A provided on a charging and discharging path of the battery B to measure a current of the battery B.

Figure 6:
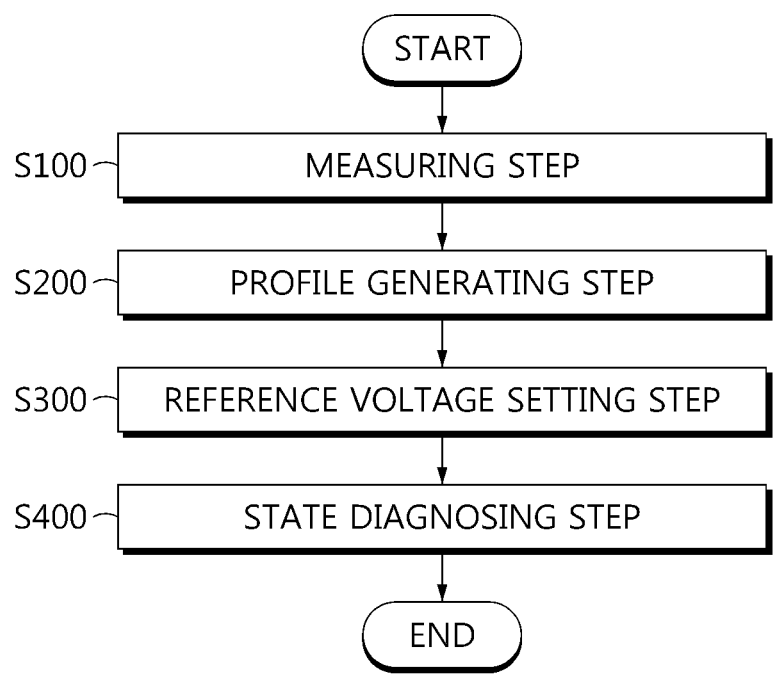
FIG. 6 is a diagram schematically showing a method for diagnosing a state of a battery according to another embodiment of the present disclosure.

FIG. 6 is a diagram schematically showing a method for diagnosing a state of a battery according to another embodiment of the present disclosure.

Here, each step of the method for diagnosing a state of a battery may be performed by the apparatus 100 for diagnosing a state of a battery. Hereinafter, for convenience of explanation, content overlapping with the previously described content will be omitted or briefly described.

Referring to FIG. 6, the method for diagnosing a state of a battery may include a measuring step (S100), a profile generating step (S200), a reference voltage setting step (S300), and a state diagnosing step (S400).

The measuring step (S100) is a step of measuring a voltage of each of a plurality of batteries, and may be performed by the measuring unit 110.

The profile generating step (S200) is a step of generating a distribution degree profile P1 for the voltage of each of the plurality of batteries measured in the measuring step (S100), and may be performed by the profile generating unit 120.

Specifically, the profile generating unit 120 may receive the voltage information for the voltage of each of the plurality of batteries measured by the measuring unit 110. In addition, the profile generating unit 120 may generate a distribution degree profile P1 for the voltage of each of the plurality of batteries based on the received voltage information.

For example, in the embodiment of FIG. 2, the profile generating unit 120 may generate the distribution degree profile P1 that follows a normal distribution in which the average voltage E1 is 3.0V.

The reference voltage setting step (S300) is a step of setting a reference voltage V1 for the distribution degree profile P1 based on a criterion profile P2 preset for the plurality of batteries, and may be performed by the control unit 130.

For example, in the embodiment of FIG. 4, the control unit 130 may calculate a voltage corresponding to the criterion density D in the distribution degree profile P1 as 2.4V by applying the criterion density D of the criterion profile P2 to the distribution degree profile P1. In addition, the control unit 130 may set the reference voltage V1 to 2.4V calculated.

The state diagnosing step (S400) is a step of diagnosing the state of each of the plurality of batteries by comparing the measured voltage of each of the plurality of batteries with the set reference voltage V1, and may be performed by the control unit 130.

For example, if the measured voltage is less than the reference voltage V1, the control unit 130 may diagnose that the state of the battery is an abnormal state. Conversely, if the measured voltage is equal to or greater than the reference voltage V1, the control unit 130 may diagnose that the state of the battery is a normal state.

As such, the method for diagnosing a state of a battery does not uniformly determine the state of a plurality of batteries using a preset threshold value, but has an advantage of diagnosing the current state of each of the plurality of batteries based on the criterion profile P2 that reflects the BOL state of the plurality of batteries and the distribution degree profile P1 that reflects the current state.

The embodiments of the present disclosure described above are not necessarily implemented by an apparatus and method but may also be implemented through a program for realizing functions corresponding to the configuration of the present disclosure or a recording medium on which the program is recorded. Such implementation may be easily performed by those skilled in the art from the above description of the embodiments.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Additionally, many substitutions, modifications and changes may be made to the present disclosure described hereinabove by those skilled in the art without departing from the technical aspects of the present disclosure, and the present disclosure is not limited to the above-described embodiments and the accompanying drawings, and each embodiment may be selectively combined in part or in whole to allow various modifications.

REFERENCE SIGNS

1: battery pack
100: apparatus for diagnosing a state of a battery
110: measuring unit
120: profile generating unit
130: control unit
140: storage unit

What is claimed is:

1. An apparatus, comprising:
a measuring unit configured to measure a voltage of each of a plurality of batteries;
a profile generating unit configured to receive voltage information for the voltage of each of the plurality of batteries measured by the measuring unit, and generate a distribution degree profile for the voltage of each of the plurality of batteries based on the received voltage information; and
a control unit configured to set a reference voltage for the distribution degree profile based on a criterion profile preset for the plurality of batteries in a beginning of life (BOL) state, and diagnose a state of each of the plurality of batteries by comparing the measured voltage of each of the plurality of batteries with the set reference voltage.

2. The apparatus according to claim 1,
wherein the profile generating unit is configured to generate the distribution degree profile representing normal distribution for the voltage of each of the plurality of batteries.

3. The apparatus according to claim 1,
wherein the criterion profile represents a distribution degree for a voltage of each of the plurality of batteries measured in the BOL state.

4. The apparatus according to claim 3,
wherein the control unit is configured to set the reference voltage for the distribution degree profile to correspond to a criterion voltage preset for the criterion profile.

5. The apparatus according to claim 4,
wherein the control unit is configured to set the reference voltage by applying a criterion density corresponding to the criterion voltage to an average voltage of the criterion profile in an entire voltage range of the criterion profile to the distribution degree profile.

6. The apparatus according to claim 5,
wherein the control unit is further configured to calculate a voltage corresponding to the criterion density in the distribution degree profile based on an average voltage of the distribution degree profile, and set the calculated voltage as the reference voltage.

7. The apparatus according to claim 1,
wherein the control unit is configured to diagnose that the state of a first battery among the plurality of batteries in which the measured voltage is less than the reference voltage is in an abnormal state.

8. The apparatus according to claim 7,
wherein the control unit is configured to diagnose that the state of a second battery among the plurality of batteries in which the measured voltage is equal to or greater than the reference voltage is in a normal state.

9. A battery pack, comprising the apparatus according to claim 1.

10. A method, comprising:
a measuring step of measuring a voltage of each of a plurality of batteries;
a profile generating step of generating a distribution degree profile for the voltage of each of the plurality of batteries measured in the measuring step;
a reference voltage setting step of setting a reference voltage for the distribution degree profile based on a criterion profile preset for the plurality of batteries in a beginning of life (BOL) state; and a state diagnosing step of diagnosing a state of each of the plurality of batteries by comparing the measured voltage of each of the plurality of batteries with the set reference voltage.

\* \* \* \* \*